United States Patent [19]
Higuchi

[11] Patent Number: 5,850,154
[45] Date of Patent: Dec. 15, 1998

[54] DATA TRANSMISSION METHOD AND DATA TRANSMISSION CIRCUIT

[75] Inventor: Tsuyoshi Higuchi, Kawasaki, Japan

[73] Assignee: Fujitsu Limited, Kanagawa, Japan

[21] Appl. No.: 711,787

[22] Filed: Sep. 10, 1996

[30] Foreign Application Priority Data

Sep. 20, 1995 [JP] Japan ..................................... 7-241519

[51] Int. Cl.⁶ ...................... H03K 19/0175; H03K 17/16
[52] U.S. Cl. ................................ 326/86; 326/30; 326/93; 326/96; 326/58
[58] Field of Search ................................. 326/30, 86, 90, 326/93, 96, 56, 58

[56] References Cited

U.S. PATENT DOCUMENTS

| | | | |
|---|---|---|---|
| 4,585,958 | 4/1986 | Chung et al. ............................... | 326/56 |
| 5,003,467 | 3/1991 | Donaldson et al. ........................ | 326/30 |
| 5,194,763 | 3/1993 | Suzuki et al. .............................. | 326/86 |
| 5,225,723 | 7/1993 | Drako et al. ................................ | 326/86 |
| 5,355,391 | 10/1994 | Horowitz et al. .......................... | 326/30 |
| 5,553,250 | 9/1996 | Miyagawa et al. ........................ | 326/30 |
| 5,646,553 | 7/1997 | Mitchell et al. ............................ | 326/86 |

*Primary Examiner*—Michael J. Tokar
*Assistant Examiner*—Richard Roseen
*Attorney, Agent, or Firm*—Nikaido Marmelstein Murray & Oral LLP

[57] ABSTRACT

A data transmission method exchanges data between at least first and second electronic devices which are coupled via a plurality of bus lines, where each of the bus lines is terminated via a terminating resistor having one end coupled to a bus line and another end applied with a terminating voltage. The data transmission method includes the steps of (a) setting a high logic level of data to a voltage higher than the terminating voltage and setting a low logic level of the data to a voltage lower than the terminating voltage, and (b) continuously outputting the data from the first electronic device to at least one bus line at a timing determined by a first clock signal by alternately repeating a state where the data is output to the one bus line and a state where an impedance between the first electronic device and the one bus line is set to a high impedance.

20 Claims, 7 Drawing Sheets

DATA TRANSMISSION METHOD AND DATA TRANSMISSION CIRCUIT

BACKGROUND OF THE INVENTION

The present invention generally relates to data transmission methods and data transmission circuits, and more particularly to a data transmission method which is especially suited for making a data transmission between electronic devices which are mounted on a printed circuit board or the like, and to a data transmission circuit which makes a data transmission using such a data transmission method.

Recently, on a mother board which forms a computer, for example, the operation speed of a microprocessor unit and the like have become high, and there are demands to realize a high-frequency operation in a data transmission path and to increase the number of parallel operating buses. As a result, heat generated from electronic device which input and output data has become a problem, and there are demands to reduce the power that is required for the data transmission.

On the other hand, in a portable equipment such as a notebook type or the so-called lap-top personal computer, a battery is used as a power supply. Hence, it is also important from the point of view of extending the serviceable life of the battery that the power required for the data transmission is reduced.

FIG. 1 is a circuit diagram showing a part of an example of a conventional data transmission circuit provided on a mother board which forms a computer.

The data transmission circuit shown in FIG. 1 includes a bus line 1 which forms a data transmission path, terminating resistors 2 and 3 which terminate the bus line 1, a VTT voltage line 4 for supplying a terminating voltage VTT, an electronic device 5 which outputs data to the bus line 1, and an electronic device 6 which inputs data from the bus line 1.

In this data transmission circuit, the bus line 1 is terminated by the terminating resistors 2 and 3 in order to reduce noise. In addition, the amplitude of data signals on the bus line 1 is set small. As a result, it is possible to reduce the power consumption of the data transmission circuit and to realize a high-speed data transmission.

FIG. 2 is a timing chart for explaining the data transmission that is made according to a conventional data transmission method employed by the data transmission circuit shown in FIG. 1. More particularly, FIG. 2 shows a clock signal CLK which determines a data transmission timing, potentials on two bus lines A and B among a plurality of bus lines.

In FIG. 2, VH denotes a voltage which is recognized as a high logic level (hereinafter simply referred to as a high level), and VL denotes a voltage which is recognized as a low logic level (hereinafter simply referred to as a low level). In this particular case, VTT=(VH+VL)/2.

In addition in FIG. 2, T11 denotes a clock cycle, T12 denotes a settling time that is required for the level of the data on the bus line to settle, T13 denotes a time that is required for the input electronic device to latch the data on the bus line, and T14 denotes a time that is required from the time when the input electronic device latches the data on the bus line to the time when the input electronic device moves to a next cycle.

In the conventional data transmission method of FIG. 2, the potential of the bus line is set to VH or VL by an output circuit of the electronic device during the time T14 that is required from the time when the input electronic device latches the data on the bus line to the time when the input electronic device moves to the next cycle. Hence, during this time T14, a potential difference exists between the bus line and the VTT voltage line, and a steady current flows from the output circuit to the VTT voltage line or from the VTT voltage line to the output circuit. As a result, unwanted power consumption occurs due to this current flow.

On the other hand, the conventional data transmission circuit shown in FIG. 1 employs a mode in which a high impedance is formed between the output circuit and the bus line. This mode is provided in order to output the data from only one electronic device to the bus line when a plurality of electronic devices are connected to the same bus line or, in order to reduce the power consumption when the bus line is not used for a relatively long time. Hence, during operation, one of the electronic devices continues to output the data to the bus line.

Accordingly, when continuously outputting the data in the conventional data transmission method of FIG. 2, the potential of the bus line must be greatly changed from VH to VL or vice versa if the logic level of the data changes. For this reason, the time T12 required for the level of the data on the bus line to settle became long, and there was a problem in that a high-speed data transmission cannot be realized.

SUMMARY OF THE INVENTION

Accordingly, it is a general object of the present invention to provide a novel and useful data transmission method and data transmission circuit, in which the problems described above are eliminated.

Another and more specific object of the present invention is to provide a data transmission method for exchanging data between at least first and second electronic devices which are coupled via a plurality of bus lines, where each of the bus lines is terminated via a terminating resistor having one end coupled to a bus line and another end applied with a terminating voltage and the data transmission method comprises the steps of (a) setting a high logic level of data to a voltage higher than the terminating voltage and setting a low logic level of the data to a voltage lower than the terminating voltage, and (b) continuously outputting the data from the first electronic device to at least one bus line at a timing determined by a first clock signal by alternately repeating a state where the data is output to the one bus line and a state where an impedance between the first electronic device and the one bus line is set to a high impedance. According to the data transmission method of the present invention, no steady current flows from an output circuit of the first electronic device to a terminating voltage line or, from the terminating voltage line to the output circuit of the first electronic device, during a time that is required from the time when the second electronic device latches the data output to the bus line to the time when the second electronic device moves to a next cycle. As a result it is possible to reduce the power that is required to make the data transmission. Moreover, when continuously outputting the data, it is sufficient to simply change the potential of the bus line from the terminating voltage to the high or low logic level if the logic level of the data changes. For this reason, it is possible to shorten a time that is required for the level of the data on the bus line to settle. Consequently, the clock cycle is reduced, and a high-speed data transmission is realized.

Still another object of the present invention is to provide a data transmission circuit for exchanging data between at least first and second electronic devices which are coupled via a plurality of bus lines, where each of the bus lines is terminated via a terminating resistor having one end coupled to a bus line and another end applied with a terminating voltage and the data transmission circuit comprises means for setting a high logic level of data to a voltage higher than the terminating voltage and setting a low logic level of the data to a voltage lower than the terminating voltage, and means, provided in the first electronic device, for continuously outputting the data from the first electronic device to at least one bus line at a timing determined by a first clock signal by alternately repeating a state where the data is output to the one bus line and a state where an impedance between the first electronic device and the one bus line is set to a high impedance. According to the data transmission circuit of the present invention, no steady current flows from an output circuit of the first electronic device to a terminating voltage line or, from the terminating voltage line to the output circuit of the first electronic device, during a time that is required from the time when the second electronic device latches the data output to the bus line to the time when the second electronic device moves to a next cycle. As a result it is possible to reduce the power that is required to make the data transmission. Moreover, when continuously outputting the data, it is sufficient to simply change the potential of the bus line from the terminating voltage to the high or low logic level if the logic level of the data changes. For this reason, it is possible to shorten a time that is required for the level of the data on the bus line to settle. Consequently, the clock cycle is reduced, and a high-speed data transmission is realized.

A further object of the present invention is to provide a data transmission method for transmitting data from a first electronic device to a second electronic device via a bus line in response to a first clock signal, where the bus line is terminated via a terminating resistor having one end coupled to the bus line and another end applied with a terminating voltage, and the data transmission method includes the following step of setting an output terminal of the first electronic device at a high impedance when the first clock signal indicates an inactive state. According to the data transmission method of the present invention, no steady current flows from an output circuit of the first electronic device to a terminating voltage line or, from the terminating voltage line to the output circuit of the first electronic device, during a time that is required from the time when the second electronic device latches the data output to the bus line to the time when the second electronic device moves to a next cycle. As a result it is possible to reduce the power that is required to make the data transmission. Moreover, when continuously outputting the data, it is sufficient to simply change the potential of the bus line from the terminating voltage to the high or low logic level if the logic level of the data changes. For this reason, it is possible to shorten a time that is required for the level of the data on the bus line to settle. Consequently, the clock cycle is reduced, and a high-speed data transmission is realized.

Another object of the present invention is to provide a semiconductor integrated circuit included in a first electronic device which is coupled to a second electronic device via a clock signal line and a bus line, where the bus line is terminated via a terminating resistor having one end coupled to the bus line and another end applied with a terminating voltage, the semiconductor integrated circuit comprises a data output terminal coupled to the one end of the bus line, a circuit generating a clock signal and outputting the clock signal to the clock signal line, and an output control circuit setting the data output terminal to a high impedance when the clock signal indicates an inactive state. According to the semiconductor integrated circuit of the present invention, no steady current flows from an output circuit of the first electronic device to a terminating voltage line or, from the terminating voltage line to the output circuit of the first electronic device, during a time that is required from the time when the second electronic device latches the data output to the bus line to the time when the second electronic device moves to a next cycle. As a result it is possible to reduce the power that is required to make the data transmission. Moreover, when continuously outputting the data, it is sufficient to simply change the potential of the bus line from the terminating voltage to the high or low logic level if the logic level of the data changes. For this reason, it is possible to shorten a time that is required for the level of the data on the bus line to settle. Consequently, the clock cycle is reduced, and a high-speed data transmission is realized.

Other objects and further features of the present invention will be apparent from the following detailed description when read in conjunction with the accompanying drawings.

DESCRIPTION OF THE PREFERRED EMBODIMENTS

First, a description will be given of a first embodiment of a data transmission circuit according to the present invention, by referring to FIGS. 3 through 6. This embodiment of the data transmission circuit employs a first embodiment of a data transmission method according to the present invention.

Figure 1:
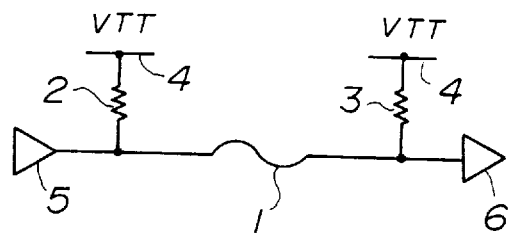
FIG. 1 is a circuit diagram showing a part of an example of a conventional data transmission circuit.
Figure 2:
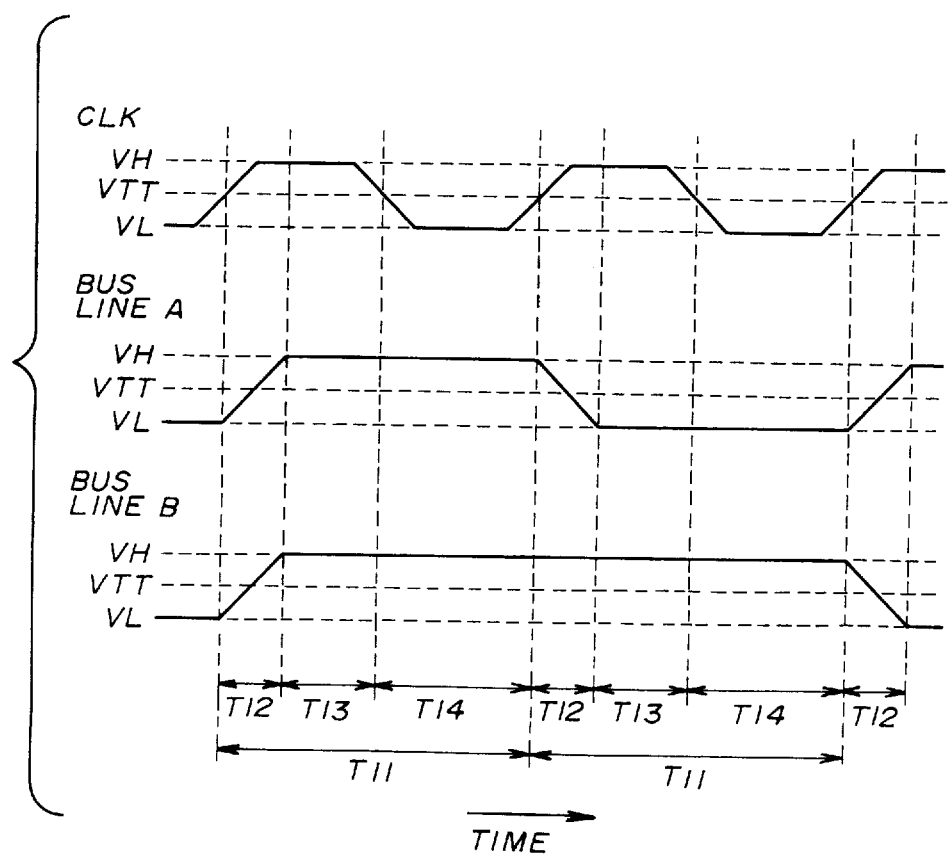
FIG. 2 is a timing chart for explaining an example of a conventional data transmission method.
Figure 3:
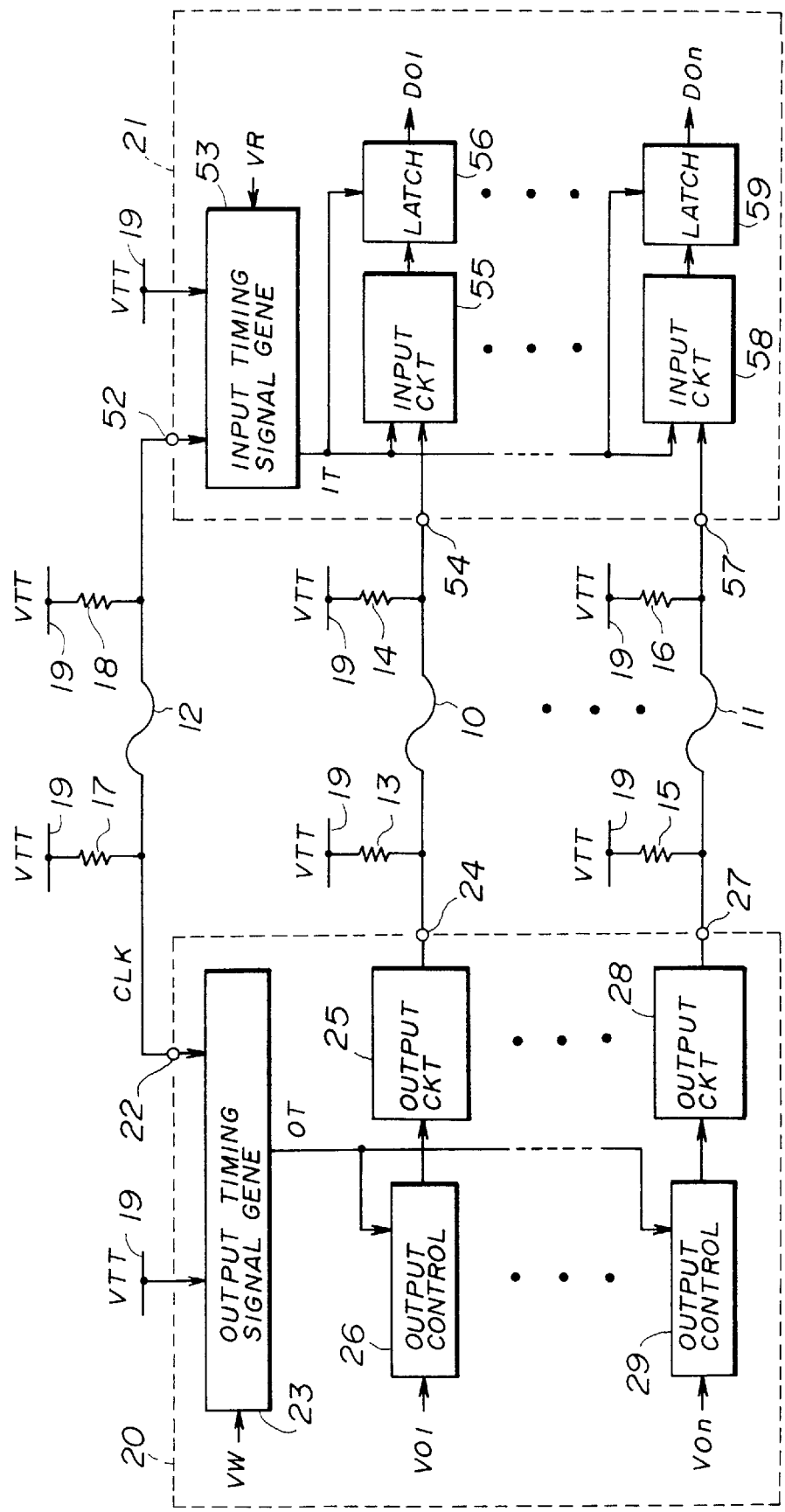
FIG. 3 is a circuit diagram showing a part of a first embodiment of a data transmission circuit according to the present invention.

FIG. 3 is a circuit diagram showing a part of the first embodiment of the data transmission circuit. The data transmission circuit may take the form of a semiconductor integrated circuit. In FIG. 3, electronic devices 20 and 21 are coupled via bus lines 10 and 11 and a clock signal line 12. The bus lines 10 and 11 form data transmission paths, and the clock signal line 12 is used to transmit a clock signal CLK. Terminating resistors 13 and 14 terminate the bus line 10, and terminating resistors 15 and 16 terminate the bus line 11. Terminating resistors 17 and 18 terminate the clock signal line 12. A VTT voltage line 19 supplies a terminating voltage VTT.

The electronic devices 20 and 21 exchange data, but for the sake of convenience, FIG. 3 only shows a part of a transmission circuit of the electronic device 20 and a part of a receiving circuit of the electronic device 21. Of course, the electronic device 20 is actually provided with a receiving circuit similar to that of the electronic device 21, and the electronic device 21 is actually provided with a transmitting circuit similar to that of the electronic device 20.

The electronic device 20 includes a clock signal input terminal 22 which is input with the clock signal CLK, and an output timing signal generating circuit 23 which amplifies a voltage difference between the clock signal CLK and the terminating voltage VTT and generates an output timing signal OT which controls an output timing of the data to the bus line. The output timing signal generating circuit 23 also receives an output timing signal generating circuit control signal VW (hereinafter simply referred to as a control signal VW) which controls active and inactive states of the output timing signal generating circuit 23.

The electronic device 20 further includes a data input/output terminal 24 which is connected to the bus line 10, an output circuit 25 which outputs data to the bus line 10 via the data input/output terminal 24, and an output control circuit 26 which controls an output operation of the output circuit 25 based on the output timing signal OT and a data VO1 which is output from an internal circuit and is to be output to the bus line 10.

The electronic device 20 is also includes a data input/output terminal 27 which is connected to the bus line 11, an output circuit 28 which outputs data to the bus line 11 via the data input/output terminal 27, and an output control circuit 29 which controls an output operation of the output circuit 28 based on the output timing signal OT and a data VOn which is output from the internal circuit and is to be output to the bus line 11.

Figure 4:
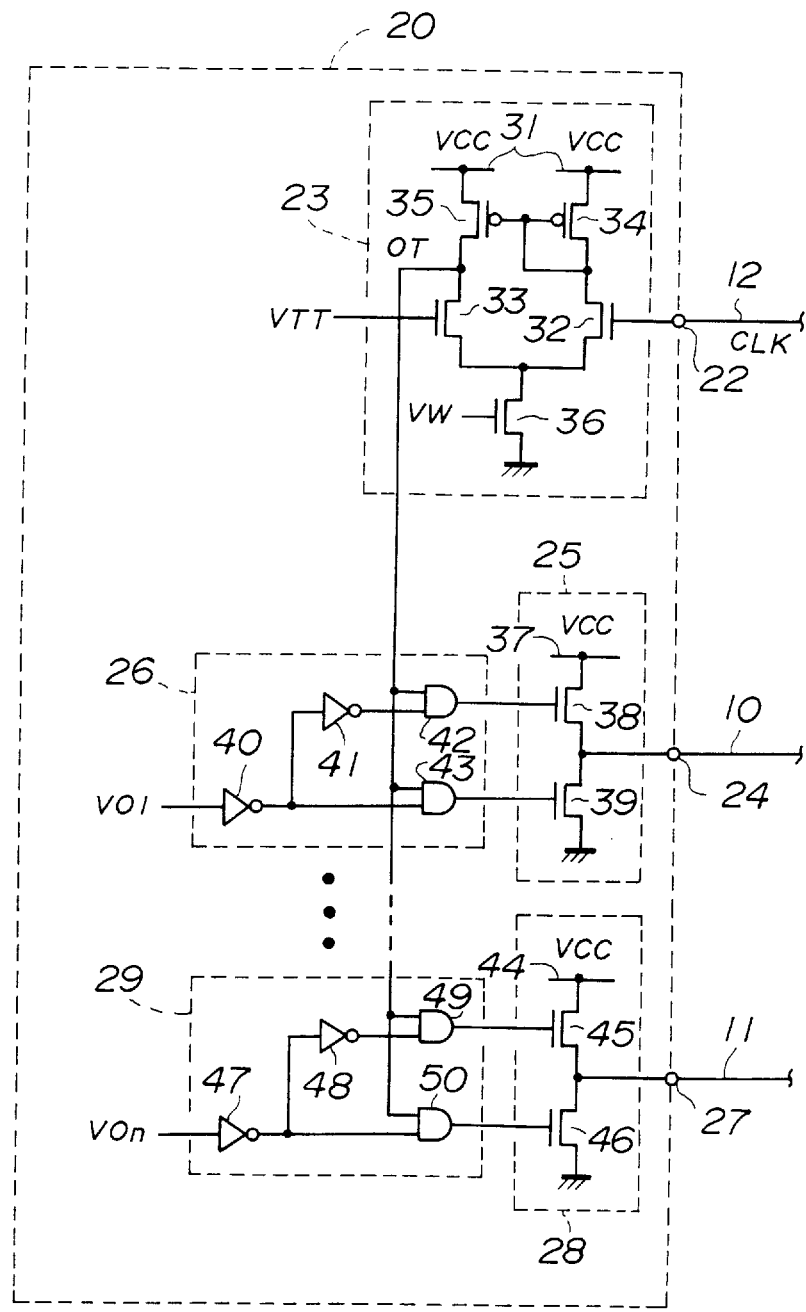
FIG. 4 is a circuit diagram showing the construction of a part of the first embodiment.

FIG. 4 is a circuit diagram showing the construction of the output timing signal generating circuit 23, the output circuits 25 and 28, and the output control circuits 26 and 29.

As shown in FIG. 4, the output timing signal generating circuit 23 is made up of a differential amplifier circuit. A VCC power supply line 31 supplies a power supply voltage VCC, and nMOS transistors 32 and 33 form driving elements. The clock signal CLK is applied to a gate of the nMOS transistor 32, and the terminating voltage VTT is applied to a gate of the nMOS transistor 33. pMOS transistors 34 and 35 form load elements. ON/OFF states of an nMOS transistor 36 are controlled by the control signal VW which is input to the output timing signal generating circuit 23.

The nMOS transistor 36 is turned OFF and the output timing signal generating circuit 23 becomes inactive when the control signal VW has a low level. On the other hand, the nMOS transistor 36 is turned ON and the output timing signal generating circuit 23 becomes active when the control signal VW has a high level.

In the state where the control signal VW has the high level and the output timing signal generating circuit 23 is active, the output timing signal OT has a low level when the potential of the clock signal CLK is smaller than the terminating voltage VTT. Further, the output timing signal OT has a high level in this state when the potential of the clock signal CLK is greater than or equal to the terminating voltage VTT.

The output circuit 25 includes a VCC power supply line 37, an NMOS transistor 38 which forms a pull-up output transistor, and an nMOS transistor 39 which forms a pull-down output transistor.

The output control circuit 26 includes an inverter 40 which inverts the data VO1, an inverter 41 which inverts an output of the inverter 40, an AND circuit 42 which obtains an AND of an output of the inverter 41 and the output timing signal OT and controls the ON/OFF states of the nMOS transistor 38, and an AND circuit 43 which obtains an AND of the output of the inverter 40 and the output timing signal OT and controls the ON/OFF states of the nMOS transistor 39.

When the output timing signal OT has the low level, the output level of the AND circuit 42 becomes low, the output level of the AND circuit 43 becomes low, the nMOS transistor 38 turns OFF, the nMOS transistor 39 turns OFF, and an impedance between the output circuit 24 and the bus line 10 becomes a high impedance.

On the other hand, when the output timing signal OT has the high level, the AND circuit 42 operates as a through circuit with respect to the output of the inverter 41, and the AND circuit 43 operates as a through circuit with respect to the output of the inverter 40.

In this case, when the data VO1 has the high level, the output level of the inverter 40 becomes low, the output level of the inverter 41 becomes high, the output level of the AND circuit 42 becomes high, the output level of the AND circuit 43 becomes low, the nMOS transistor 38 turns ON, the nMOS transistor 39 turns OFF, and the potential of the bus line 10 becomes a high level.

In addition, when the data VO1 has the low level, the output level of the inverter 40 becomes high, the output level of the inverter 41 becomes low, the output level of the AND circuit 42 becomes low, the output level of the AND circuit 43 becomes high, the nMOS transistor 38 turns OFF, the nMOS transistor 39 turns ON, and the potential of the bus line 10 becomes a low level.

The output circuit 28 includes a VCC power supply line 44, an NMOS transistor 45 which forms a pull-up output transistor, and an nMOS transistor 46 which forms a pull-down output transistor.

The output control circuit 29 includes an inverter 47 which inverts the data VOn, an inverter 48 which inverts an output of the inverter 47, an AND circuit 49 which obtains an AND of an output of the inverter 48 and the output timing signal OT and controls the ON/OFF states of the nMOS transistor 45, and an AND circuit 50 which obtains an AND of the output of the inverter 47 and the output timing signal OT and controls the ON/OFF states of the nMOS transistor 46.

When the output timing signal OT has the low level, the output level of the AND circuit 49 becomes low, the output level of the AND circuit 50 becomes low, the nMOS transistor 45 turns OFF, the nMOS transistor 46 turns OFF, and an impedance between the output circuit 28 and the bus line 11 becomes a high impedance.

On the other hand, when the output timing signal OT has the high level, the AND circuit 49 operates as a through circuit with respect to the output of the inverter 48, and the AND circuit 50 operates as a through circuit with respect to the output of the inverter 47.

In this case, when the data VOn has the high level, the output level of the inverter 47 becomes low, the output level of the inverter 48 becomes high, the output level of the AND circuit 49 becomes high, the output level of the AND circuit 50 becomes low, the nMOS transistor 45 turns ON, the nMOS transistor 46 turns OFF, and the potential of the bus line 11 becomes a high level.

In addition, when the data VOn has the low level, the output level of the inverter 47 becomes high, the output level of the inverter 48 becomes low, the output level of the AND circuit 49 becomes low, the output level of the AND circuit 50 becomes high, the nMOS transistor 45 turns OFF, the nMOS transistor 46 turns ON, and the potential of the bus line 11 becomes a low level.

On the other hand, the electronic device 21 shown in FIG. 3 includes a clock signal input terminal 52 which is input with the clock signal CLK, and an input timing signal generating circuit 53 which amplifies a voltage difference between the clock signal CLK and the terminating voltage VTT and generates an input timing signal IT which controls an input timing of the data on the bus line. The input timing signal generating circuit 53 also receives an input timing signal generating circuit control signal VR (hereinafter simply referred to as a control signal VR) which controls active and inactive states of the input timing signal generating circuit 53.

The electronic device 21 further includes a data input/output terminal 54 which is connected to the bus line 10, an input circuit 55 which inputs the data on the bus line 10 via the data input/output terminal 54 under the control of the input timing signal IT, and a latch circuit 56 which latches a data DO1 which is output from the input circuit 55.

The electronic device 21 also includes a data input/output terminal 57 which is connected to the bus line 11, an input circuit 58 which inputs the data on the bus line 11 via the data input/output terminal 57 under the control of the input timing signal IT, and a latch circuit 59 which latches a data DOn which is output from the input circuit 58.

Figure 5:
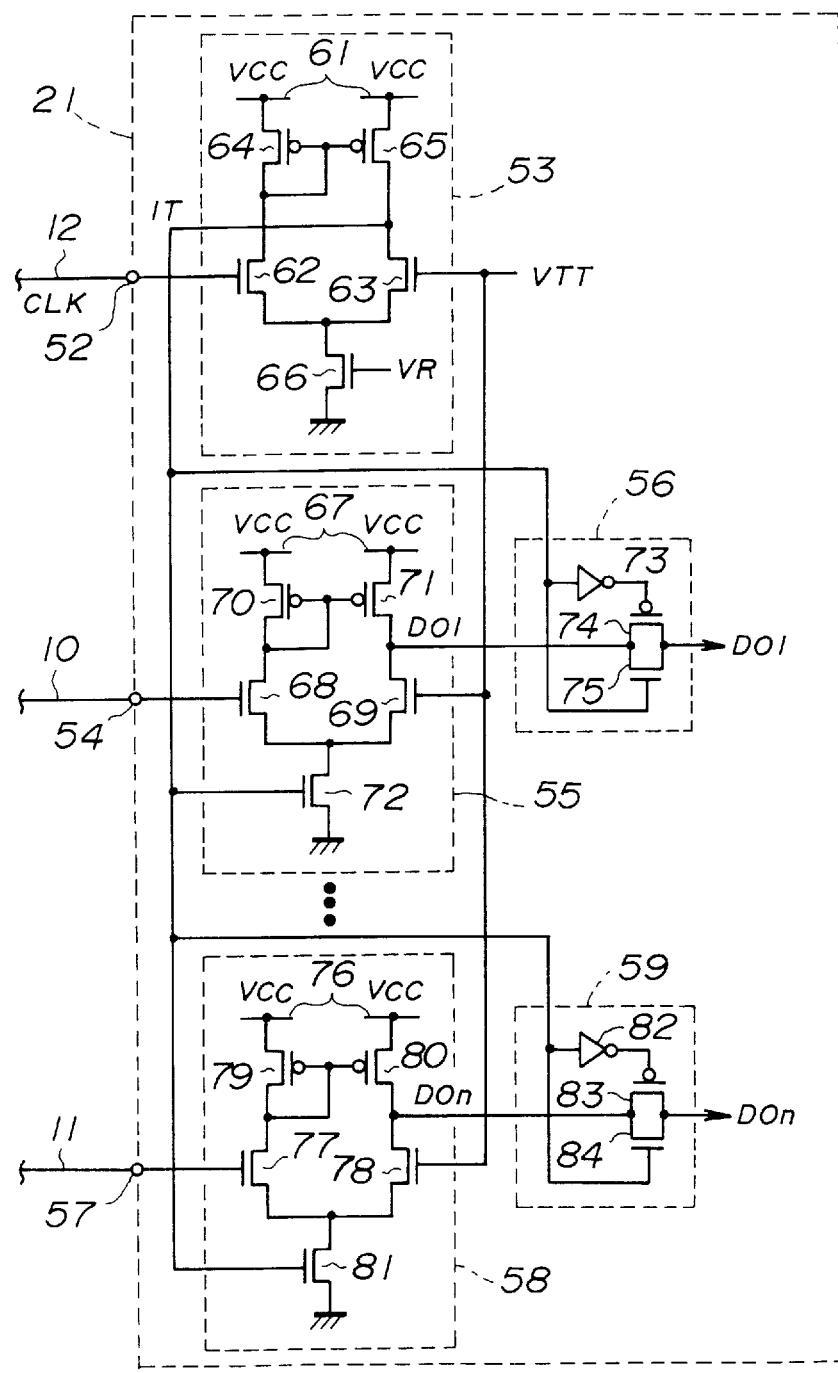
FIG. 5 is a circuit diagram showing the construction of another part of the first embodiment.

FIG. 5 is a circuit diagram showing the construction of the input timing signal generating circuit 53, the input circuits 55 and 58, and the latch circuits 56 and 59.

As shown in FIG. 5, the input timing signal generating circuit 53 is made up of a differential amplifier circuit. A VCC power supply line 61 supplies a power supply voltage VCC, and nMOS transistors 62 and 63 form driving elements. The clock signal CLK is applied to a gate of the nMOS transistor 62, and the terminating voltage VTT is applied to a gate of the nMOS transistor 63. pMOS transistors 64 and 65 form load elements. ON/OFF states of an nMOS transistor 66 are controlled by the control signal VR which is input to the input timing signal generating circuit 53.

The nMOS transistor 66 is turned OFF and the input timing signal generating circuit 53 becomes inactive when the control signal VR has a low level, On the other hand, the nMOS transistor 66 is turned ON and the input timing signal generating circuit 53 becomes active when the control signal VR has a high level.

In the case where the control signal VR has the high level and the input timing signal generating circuit 53 is active, the input timing signal IT has a low level when the potential of the clock signal CLK is smaller than the terminating voltage VTT, and the input timing signal IT has a high level when the potential of the clock signal CLK is greater than or equal to the terminating voltage VTT.

In addition, the input circuit 55 is made up of a differential amplifier circuit. The input circuit 55 includes a VCC power supply line 67 which supplies the power supply voltage VCC, and nMOS transistors 68 and 69 which form driving elements. The voltage of the bus line 10 is applied to a gate of the nMOS transistor 68, and the terminating voltage VTT is applied to a gate of the nMOS transistor 69. pMOS transistors 70 and 71 form load elements. ON/OFF states of an nMOS transistor 72 are controlled by the input timing signal IT.

The nMOS transistor 72 turns OFF and the input circuit 55 becomes inactive when the input timing signal IT has the low level. On the other hand, the nMOS transistor 72 turns ON and the input circuit 55 becomes active when the input timing signal IT has the high level.

The latch circuit 56 includes an inverter 73 which inverts the input timing signal IT, a pMOS transistor 74 which is turned ON/OFF depending on an output of the inverter 73, and an nMOS transistor 75 which is turned ON/OFF depending on the input timing signal IT.

If the input signal IT has the high level and the input circuit 55 is active, the output DO1 of the input circuit 55 has a high level when the potential of the bus line 10 has a high level, and the output DO1 of the input circuit 55 has a low level when the potential of the bus line 10 has a low level.

In this case, the output level of the inverter 73 becomes low, the pMOS transistor 74 turns ON, and the nMOS transistor 75 turns ON in the latch circuit 56. Hence, the latch circuit 56 passes the output DO1 of the input circuit 55.

In this state, if the input timing signal IT assumes the low level and the input circuit 55 becomes inactive, the output level of the inverter 73 becomes high, the pMOS transistor 74 turns OFF and the nMOS transistor 75 turns OFF in the latch circuit 56. Thus, the output DO1 of the input circuit 55 is latched by the latch circuit 56.

The input circuit 58 is made up of a differential amplifier circuit. The input circuit 58 includes a VCC power supply line 76 which supplies the power supply voltage VCC, and nMOS transistors 77 and 78 which form driving elements. The voltage of the bus line 11 is applied to a gate of the nMOS transistor 77, and the terminating voltage VTT is applied to a gate of the nMOS transistor 78. pMOS transistors 79 and 80 form load elements. ON/OFF states of an nMOS transistor 81 are controlled by the input timing signal IT.

The nMOS transistor 81 turns OFF and the input circuit 58 becomes inactive when the input timing signal IT has the low level. On the other hand, the nMOS transistor 81 turns ON and the input circuit 58 becomes active when the input timing signal IT has the high level.

The latch circuit 59 includes an inverter 82 which inverts the input timing signal IT, a pMOS transistor 83 which is turned ON/OFF depending on an output of the inverter 82, and an nMOS transistor 84 which is turned ON/OFF depending on the input timing signal IT.

If the input signal IT has the high level and the input circuit 58 is active, the output DOn of the input circuit 58 has a high level when the potential of the bus line 11 has a high level, and the output DOn of the input circuit 58 has a low level when the potential of the bus line 11 has a low level.

In this case, the output level of the inverter 82 becomes low, the pMOS transistor 83 turns ON, and the nMOS transistor 84 turns ON in the latch circuit 59. Hence, the latch circuit 59 passes the output DOn of the input circuit 58.

In this state, if the input timing signal IT assumes the low level and the input circuit 58 becomes inactive, the output level of the inverter 82 becomes high, the pMOS transistor 83 turns OFF and the nMOS transistor 84 turns OFF in the latch circuit 59. Thus, the output DOn of the input circuit 58 is latched by the latch circuit 59.

Figure 6:
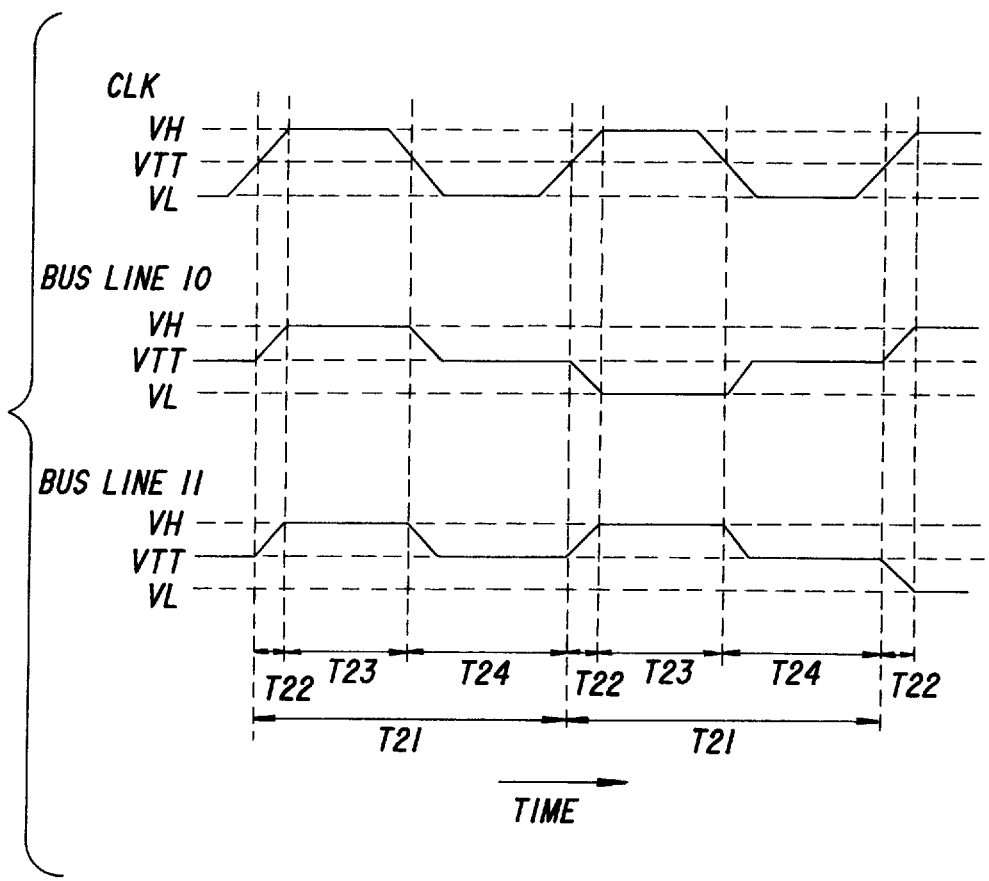
FIG. 6 is a timing chart for explaining the operation of the first embodiment.

FIG. 6 is a timing chart for explaining the operation of the first embodiment. More particularly, FIG. 6 shows the clock signal CLK which determines the data transmission timing, and the potentials of the bus lines 10 and 11.

In FIG. 6, VH denotes a voltage which is recognized as the high logic level, and VL denotes a voltage which is recognized as the low logic level. In this embodiment, VTT=(VH+VL)/2.

Further, in FIG. 6, T21 denotes a clock cycle, T22 denotes a settling time which is required for the level of the data on the bus line to settle, T23 denotes a time which is required for the input electronic device to latch the data on the bus line, and T24 denotes a time that is required from the time when the input electronic device latches the data on the bus line to the time when the input electronic device moves to a next cycle.

In the case where the output timing signal generating circuit 23 is active in the electronic device 20, the impedance between the output circuit 25 and the bus line 10 is set to a high impedance when the potential of the clock signal CLK is smaller than the terminating voltage VTT. In addition, the potential of the bus line 10 is set to the terminating voltage VTT, the impedance between the output circuit 28 and the bus line 11 is set to a high impedance, and the potential of the bus line 11 is set to the terminating voltage VTT.

Thereafter, when the potential of the clock signal CLK becomes greater than or equal to the terminating voltage VTT, a data having the same level as the data VO1 is output from the output circuit 25 to the bus line 10, and a data having the same level as the data VOn is output from the output circuit 28 to the bus line 11. For example, if the data VO1 and VOn have the high level, the potentials of the bus lines 10 and 11 become VH.

Then, when the potential of the clock signal CLK becomes smaller than the terminating voltage VTT, the impedance between the output circuit 25 and the bus line 10 is again set to the high impedance, and the potential of the bus line 10 is set to the terminating voltage VTT. Further, the impedance between the output circuit 28 and the bus line 11 is again set to the high impedance, and the potential of the bus line 11 is set to the terminating voltage VTT.

Thereafter, when the potential of the clock signal CLK becomes greater than or equal to the terminating voltage VTT, a data having the same level as the data VO1 is output from the output circuit 25 to the bus line 10, and a data having the same level as the data VOn is output from the output circuit 28 to the bus line 11. For example, if the data VO1 has the low level and the data VOn has the high level, the potential of the bus line 10 is set to VH and the potential of the bus line 11 is set to VL.

On the other hand, in the case where the input timing signal generating circuit 53 is active in the electronic device 21, the level of the input timing signal IT becomes low and the input circuits 55 and 58 become inactive when the potential of the clock signal CLK is smaller than the terminating voltage VTT. Hence, the input circuits 55 and 58 do not input data in this state.

Thereafter, when the potential of the clock signal CLK becomes greater than or equal to the terminating voltage VTT, the input circuits 55 and 58 become active and each carry out a data input operation. For example, if the potentials of the bus lines 10 and 11 are set to VH, the levels of the outputs DO1 and DOn of the input circuits 55 and 58 become high.

Then, when the potential of the clock signal CLK becomes smaller than the terminating voltage VTT, the level of the input timing signal IT becomes low, and the input circuits 55 and 58 again become inactive. Hence, the input circuits 55 and 58 do not input data in this state. Furthermore, the output DO1 of the input circuit 55 is latched by the latch circuit 56, and the output COn of the input circuit 58 is latched by the latch circuit 59.

Thereafter, when the potential of the clock signal CLK becomes greater than or equal to the terminating voltage VTT, the input circuits 55 and 58 become active and each carry out a data input operation. For example, when the potential of the bus line 10 is set to VL and the potential of the bus line 11 is set to VH, the level of the output DO1 of the input circuit 55 becomes low and the level of the output DOn of the input circuit 58 become high.

Therefore, according to this first embodiment, the operation of continuously outputting the data from the electronic device is realized by alternately repeating a state where the data is output at the timing which is determined by the clock signal CLK and a high impedance state.

In other words, during the time T24 that is required from the time when the input electronic device latches the data output to the bus line to the time when the input electronic device moves to the next cycle, the impedance between the output circuit of the output electronic device and the bus line is set to the high impedance, and the potential of the bus line is set to the terminating voltage VTT.

Accordingly, in this first embodiment, no steady current flows from the output circuit of the output electronic device to the VTT voltage line or, from the VTT voltage line to the output circuit of the output electronic device, during the above described time T24. As a result it is possible to reduce the power that is required to make the data transmission.

Moreover, when continuously outputting the data in this first embodiment, it is sufficient to simply change the potential of the bus line from VTT to VL or to VH if the logic level of the data changes.

For this reason, it is possible to shorten the time T22 that is required for the level of the data on the bus line to settle. Consequently, the clock cycle is reduced, and a high-speed data transmission is realized.

Next, a description will be given of a second embodiment of the data transmission circuit according to the present invention. This second embodiment of the data transmission circuit employs a second embodiment of the data transmission method according to the present invention.

Figure 7:
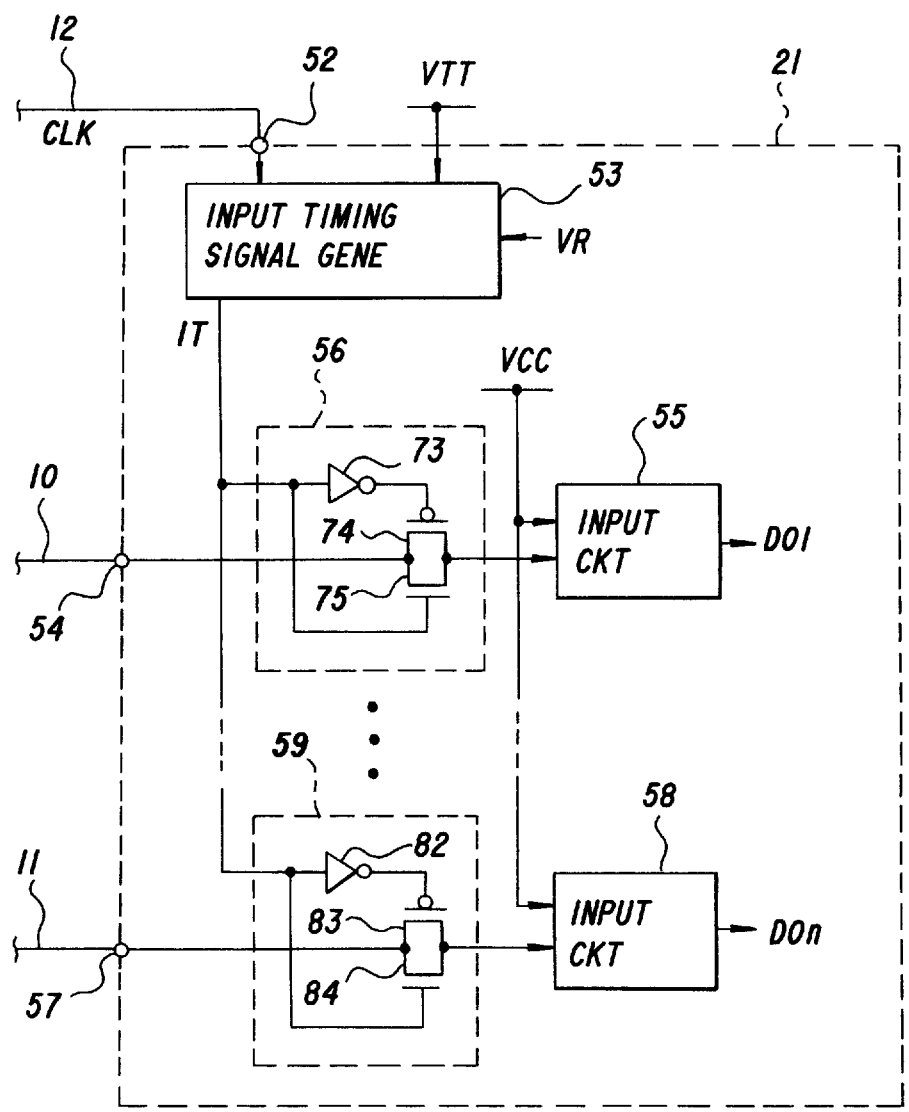
FIG. 7 is a circuit diagram showing a part of a second embodiment of the data transmission circuit according to the present invention.

FIG. 7 is a circuit diagram showing a part of the second embodiment of the data transmission circuit. More particularly, FIG. 7 shows the construction of the electronic device 21. In FIG. 7, those parts which are the same as those corresponding parts in FIGS. 3 and 5 are designated by the same reference numerals, and a description thereof will be omitted.

In this second embodiment, the latch circuits 56 and 59 are respectively provided at stages preceding the input circuits 55 and 58 as shown in FIG. 7. In addition, the power supply voltage VCC is supplied to the nMOS transistors 72 and 81 of the input circuits 55 and 58 in place of the input timing signal IT. Otherwise, the remaining parts of the data transmission circuit are the same as those of the first embodiment described above.

In this second embodiment, when the input timing signal IT is set to the high level, the pMOS transistors 74 and 83 turn ON and the nMOS transistors 75 and 84 turn ON in the latch circuits 56 and 59. Hence, the data on the bus lines 10 and 11 are transmitted to the input circuits 55 and 58 via the corresponding latch circuits 56 and 59. The input circuits 55 and 58 amplify the data transmitted via the bus lines 10 and 11.

On the other hand, when the input timing signal IT is set to the low level, the pMOS transistors 74 and 83 turn OFF and the nMOS transistors 75 and 84 turn OFF in the latch circuits 56 and 59. Thus, the data on the bus lines 10 and 11 are latched by the corresponding latch circuits 56 and 59, and the input circuits 55 and 58 do not input data in this state. In this state, the input circuits 55 and 58 amplified the latched data.

Therefore, this second embodiment can obtain the same advantageous effects as the first embodiment described above. More particularly, according to this second embodiment, during the time T24 that is required from the time when the input electronic device latches the data output to the bus line to the time when the input electronic device moves to the next cycle, no steady current flows from the output circuit of the output electronic device to the VTT voltage line or, from the VTT voltage line to the output circuit of the output electronic device. As a result it is possible to reduce the power that is required to make the data transmission.

Moreover, when continuously outputting the data in this second embodiment, it is sufficient to simply change the potential of the bus line from VTT to VL or to VH if the logic level of the data changes. For this reason, it is possible to shorten the time T22 that is required for the level of the data on the bus line to settle. Consequently, the clock cycle is reduced, and a high-speed data transmission is realized.

In each of the first and second embodiments described above, the output timing signal generating circuit 23 is provided, the output timing signal OT which is synchronized to the clock signal CLK is generated, the input timing signal generating circuit 53 is provided, and the input timing signal IT which is synchronized to the clock signal CLK is generated. But instead, it is possible to use a phase locked loop (PLL) circuit or a delay line locked (DLL) circuit to generate the signals which are synchronized to the clock signal CLK.

In addition, the first and second embodiments described above use the nMOS transistors 38 and 45 as the pull-up output transistors. However, it is possible to provide pMOS transistors instead, and provide NAND circuits in place of the AND circuits 42 and 49 or, connect inverters at stages subsequent to the AND circuits 42 and 49.

Furthermore, the electronic devices 20 and 21 of the first and second embodiments described above may carry out the data output operation and the data input operation at the same clock timing based on the same clock signal. Alternately, it is possible for the electronic devices 20 and 21 to carry out the data output operation and the data input operation at different clock timings based on two different clock signals having mutually different timings.

Figure 8:
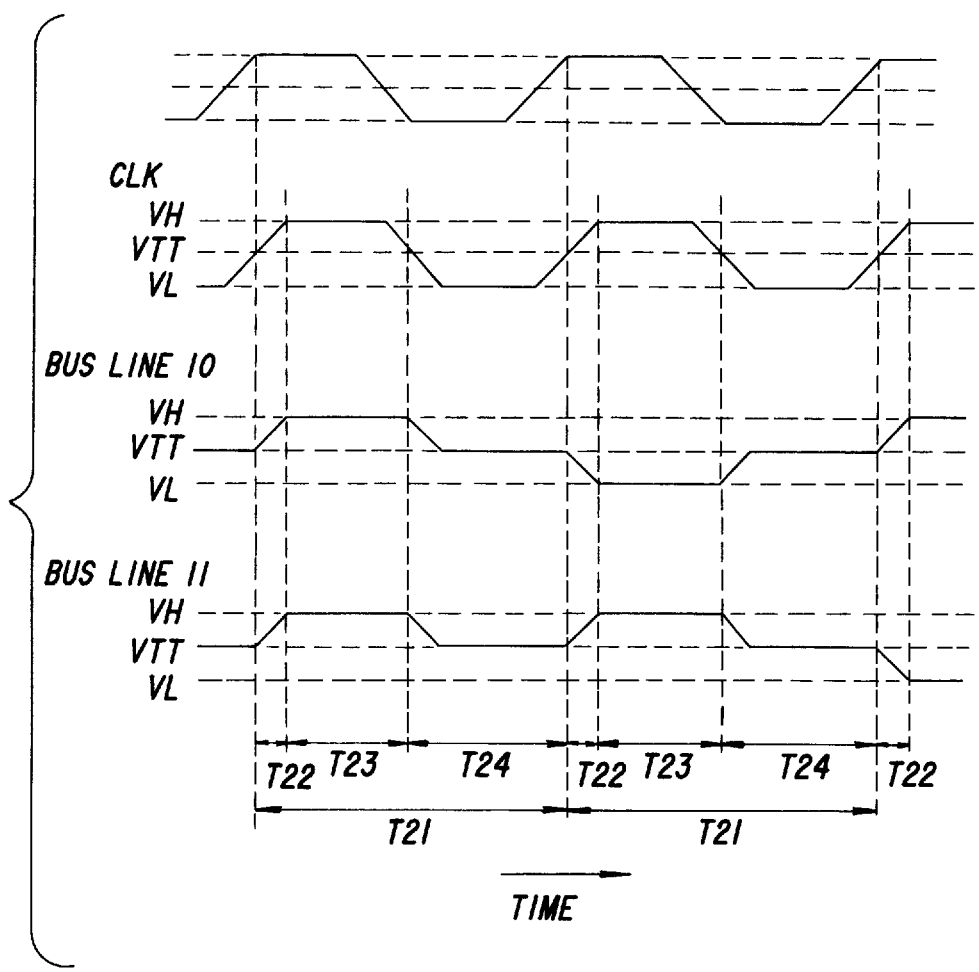
FIG. 8 is a timing chart for explaining the operation of the first embodiment for a case where data output and data input operations are carried out based on clock signals having mutually different timings.

FIG. 8 is a timing chart for explaining the operation of the first embodiment for a case where the electronic devices 20 and 21 carry out the data output operation and the data input operation at different clock timings based on two different clock signals having mutually different timings. In FIG. 8, those parts which are the same as those corresponding parts in FIG. 6 are designated by the same reference characters, and a description thereof will be omitted. In FIG. 8, CLK1 indicates the clock signal having the timing which determines the data output operation, and CLK2 indicates the clock signal having the timing which determines the data input operation, where the clock signals CLK1 and CLK2 have mutually different timings as shown.

Moreover, in the electronic device 21 of the first and second embodiments described above, the latch circuits 56 and 59 are described as being independent from the input circuits 55 and 58. However, it is possible to form one input circuit from the input circuit 55 and the latch circuit 56, and to form one input circuit from the input circuit 58 and the latch circuit 59.

Therefore, according to the present invention, it is possible to reduce the heat generation and the power consumption of the electronic devices which carry out the data transmission. For this reason, it is possible to increase the number of bus lines, realize a high-speed data transmission, reduce the package cost of the electronic device, and reduce the cost of a cooling unit that is used to cool the electronic device. The present invention is particularly effective when applied to a portable equipment because it is possible to increase the serviceable life of the battery that is used as the power supply of the portable equipment.

Further, the present invention is not limited to these embodiments, but various variations and modifications may be made without departing from the scope of the present invention.

What is claimed is:

1. A data transmission method for exchanging data between at least first and second electronic devices which are coupled via a plurality of bus lines, each of the bus lines being terminated via a terminating resistor having one end coupled to a respective busline and another end applied with a terminating voltage, said data transmission method comprising the steps of:

(a) setting a high logic level of data to a voltage higher than the terminating voltage and setting a low logic level of the data to a voltage lower than the terminating voltage; and (b) continuously outputting the data from the first electronic device to at least one bus line at a timing determined by a first clock signal by alternately repeating, within one cycle of the first clock signal, a state where the data is output to said at least one bus line and a state where an impedance between the first electronic device and said at least one bus line is set to a high impedance.

2. The data transmission method as claimed in claim 1, which further comprises the steps of:

(c) exchanging the first clock signal between the first and second electronic devices via a clock signal line which is terminated via a terminating resistor having one end coupled to the clock signal line and another end applied with the terminating voltage.

3. The data transmission method as claimed in claim 1, which further comprises the steps of:

(c) continuously inputting the data from said at least one bus line to the second electronic device at a timing determined by a second clock signal by alternately repeating, within one cycle of the second clock signal a state where the data is input from said at least one bus line and a state where no data is input from said at least one bus line.

4. The data transmission method as claimed in claim 3, wherein said first clock signal and said second clock signal are synchronized.

5. The data transmission method as claimed in claim 4, which further comprises the steps of:

(d) exchanging the first and second clock signals between the first and second electronic devices via a clock signal line which is terminated via a terminating resistor having one end coupled to the clock signal line and another end applied with the terminating voltage.

6. The data transmission method as claimed in claim 3, wherein said first clock signal and said second clock signal have mutually different clock timings.

7. A data transmission method for transmitting data from a first electronic device to a second electronic device via a bus line in response to a first clock signal, said bus line being terminated via a terminating resistor having one end coupled to the bus line and another end applied with a terminating voltage, said data transmission method including the following step of:

setting an output terminal of the first electronic device at a high impedance when the first clock signal indicates an inactive state, so that a state where data is output to the bus line and a state where an impedance between the first electronic device and the bus line is set to a high impedance is alternately repeated within one cycle of the clock signal.

8. A data transmission circuit for exchanging data between at least first and second electronic devices which are coupled via a plurality of bus lines, each of the bus lines being terminated via a terminating resistor having one end coupled to a respective bus line and another end applied with a terminating voltage, said data transmission circuit comprising:

means for setting a high logic level of data to a voltage higher than the terminating voltage and setting a low logic level of the data to a voltage lower than the terminating voltage; and means, provided in the first electronic device, for continuously outputting the data from the first electronic device to at least one bus line at a timing determined by a first clock signal by alternately repeating, within one cycle of the first clock signal, a state where the data is output to said at least one bus line and a state where an impedance between the first electronic device and said at least one bus line is set to a high impedance.

9. The data transmission circuit as claimed in claim 8, which further comprises:

means for exchanging the first clock signal between the first and second electronic devices via a clock signal line which is terminated via a terminating resistor having one end coupled to the clock signal line and another end applied with the terminating voltage.

10. The data transmission circuit as claimed in claim 8, which further comprises:

means, provided in the second electronic device, for continuously inputting the data from said at least one bus line to the second electronic device at a timing determining by a second clock signal by alternately repeating, within one cycle of the second clock signal, a state where the data is input from said at least one bus line and a state where no data is input from said at least one bus line.

11. The data transmission circuit as claimed in claim 10, wherein said first clock signal and said second clock signal are synchronized.

12. The data transmission circuit as claimed in claim 11, which further comprises:

means for exchanging the first and second clock signals between the first and second electronic devices via a clock signal line which is terminated via a terminating resistor having one end coupled to the clock signal line and another end applied with the terminating voltage.

13. The data transmission circuit as claimed in claim 10, wherein said first clock signal and said second clock signal have mutually different clock timings.

14. A semiconductor integrated circuit included in a first electronic device which is coupled to a second electronic device via a clock signal line and a bus line, said bus line being terminated via a terminating resistor having one end coupled to the bus line and another end applied with a terminating voltage, said semiconductor integrated circuit comprising:

a data output terminal coupled to the bus line;

a circuit generating a clock signal and outputting the clock signal to the clock signal line; and an output control circuit setting said date output terminal to a high impedance when the clock signal indicates an inactive state so that a state where data is output to the bus line and a state where an impedance between the first electronic device and the bus line is set to a high impedance is alternately repeated within one cycle of the clock signal.

15. A data transmission method for exchanging data between at least first and second electronic devices which are coupled via a plurality of bus lines, each of the bus lines being terminated via a terminating resistor having one end coupled to a respective bus line and another end applied with a terminating voltage, said data transmission method comprising the steps of:

(a) setting a high logic level of data to a voltage higher than the terminating voltage and setting a low logic level of the data to a voltage lower than the terminating voltage;

(b) continuously outputting the data from the first electronic device to at least one bus line at a timing determined by a first clock signal by alternately repeating a state where the data is output to said at least one bus line and a state where an impedance between the first electronic device and said at least one bus line is set to high impedance; and (c) exchanging the first clock signal between the first and second electronic devices via a clock signal line which is terminated via a terminating resistor having one end coupled to the clock signal line and another end applied with the terminating voltage.

16. A data transmission method for exchanging data between at least first and second electronic devices which are coupled via a plurality of bus lines, each of the bus lines being terminated via a terminating resistor having one end coupled to a respective bus line and another end applied with a terminating voltage, said data transmission method comprising the steps of:

(a) setting a high logic level of data to a voltage higher than the terminating voltage and setting a low logic level of the data to a voltage lower than the terminating voltage;

(b) continuously outputting the data from the first electronic device to at least one bus line at a timing determined by a first clock signal by alternately repeating a state where the data is output to said at least one bus line and a state where an impedance between the first electronic device and said at least one bus line is set to high impedance; and (c) continuously inputting the data from said at least one bus line to the second electronic device at a timing determined by a second clock signal by alternately repeating a state where the data is input from said at least one bus line and a state where no data is input from said at least one bus line wherein said first clock signal and said second clock signal are synchronized.

17. The data transmission method as claimed in claim 16, which further comprises the steps of:

(d) exchanging the first and second clock signals between the first and second electronic devices via a clock signal line which is terminated via a terminating resistor having one end coupled to the clock signal line and another end applied with the terminating voltage.

18. A data transmission circuit for exchanging data between at least first and second electronic devices which are coupled via a plurality of bus lines, each of the bus lines being terminated via a terminating resistor having one end coupled to a respective bus line and another end applied with a terminating voltage, said data transmission circuit comprising:

means for setting a high logic level of data to a voltage higher than the terminating voltage and setting a low logic level of the data to a voltage lower than the terminating voltage;

means, provided in the first electronic device, for continuously outputting the data from the first electronic device to at least one bus line at a timing determined by a first clock signal by alternately repeating a state where the data is output to said at least one bus line and a state where an impedance between the first electronic device and said at least one bus line is set to a high impedance; and means for exchanging the first clock signal between the first and second electronic devices via a clock signal line which is terminated via a terminating resistor having one end coupled to the clock signal line and another end applied with the terminating voltage.

19. A data transmission circuit for exchanging data between at least first and second electronic devices which are coupled via a plurality of bus lines, each of the bus lines being terminated via a terminating resistor having one end coupled to a respective bus line and another end applied with a terminating voltage, said data transmission circuit comprising:

means for setting a high logic level of data to a voltage higher than the terminating voltage and setting a low logic level of the data to a voltage lower than the terminating voltage;

means, provided in the first electronic device, for continuously outputting the data from the first electronic device to at least one bus line at a timing determined by a first clock signal by alternately repeating a state where the data is output to said at least one bus line and a state where an impedance between the first electronic device and said at least one bus line is set to a high impedance; and means, provided in the second electronic device, for continuously inputting the data from said at least one bus line to the second electronic device at a timing determined by a second clock signal by alternately repeating a state where the data is input from said at least one bus line and a state where no data is input from said at least one bus line wherein said first clock signal and said second clock signal are synchronized.

20. The data transmission circuit as claimed in claim 19, which further comprises:

means for exchanging the first and second clock signals between the first and second electronic devices via a clock signal line which is terminated via a terminating resistor having one end coupled to the clock signal line and another end applied with the terminating voltage.

* * * * *